310-10 SR
FIP8502 XR 3,184,620 SS REFERENCE SEARCH ROOM

May 18, 1965 D. LEIBOWITZ ETAL 3,184,620

SOLID STATE SINE-COSINE SOURCE

Filed May 4, 1962 2 Sheets-Sheet 1

DONALD LEIBOWITZ
ARTHUR E. MEIXNER
SOL GRUBER
INVENTORS
BY S. A. Giarratana
George B. Oujevolk
ATTORNEYS May 18, 1965 D. LEIBOWITZ ETAL 3,184,620

SOLID STATE SINE-COSINE SOURCE

Filed May 4, 1962 2 Sheets-Sheet 2

DONALD LEIBOWITZ
ARTHUR E. MEIXNER
SOL GRUBER
INVENTORS

BY S. A. Giarratana
George B. Oujevolk
ATTORNEYS

United States Patent Office 3,184,620

Patented May 18, 1965

3,184,620
SOLID STATE SINE-COSINE SOURCE

Donald Leibowitz, Bronx, N.Y., Arthur E. Meixner, Hackensack, N.J., and Sol Gruber, Brooklyn, N.Y., assignors to General Precision Inc., Little Falls, N.J., a corporation of Delaware Filed May 4, 1962, Ser. No. 192,518
2 Claims. (Cl. 310—2)

The present invention relates to solid state synchro and resolver type components and more particularly to a sine-cosine source component operating on the principle of the Hall-effect.

Synchros or resolvers are components used extensively in computer and control systems and generally will furnish an electrical value corresponding to the sine or cosine of a rotating component coupled thereto. At present, these are wire wound transformer type components and are relatively large. The Hall effect is the development of a transverse electric potential-gradient in a current-carrying conductor upon the application of a magnetic field (The International Dictionary of Physics and Electronics, D. Van Nostrand Company, Inc., New York, 1956). The Hall voltage produced by the Hall effect is usually expressed by the formula $V_H=KI_xB_y$ where $I_x$ is the current flowing in the $x$ direction, $B_y$ is the magnetic field in the $y$ direction and K is a constant determined by the characteristics of the crystal Hall generator when the $x$ and $y$ directions are at right angles. The formula is usually abbreviated $V_H=KIB$.

With the recent development of semiconductor materials, workable Hall generators have been developed. Semiconductor Hall crystal devices readily lend themselves to a much higher degree of miniaturization than corresponding wire wound components. The entire package of a size 4 Hall crystal is about 1⁄16 inch x 5⁄32 inch x 0.010 inch while a similar package for a size 11 Hall crystal is about 0.190 inch x 0.450 inch x 0.022 inch. When attempts are made to use these small components as the sine-cosine source of a revolving device, certain problems are encountered. This fact is readily apparent when the sizes described are pictured against the background of an inch ruler. Some of these problems have already been described in the pending application of my fellow employee, Sigmund Harac, Ser. No. 63,252, filed October 18, 1960, wherein in Table I of said application, a comparison was made between the true sine and the sine value obtained when a commercially available Hall generator was rotated on a shaft in a magnetic field. In this table, where the functional error percentage was defined as the true sine value minus the actual reading, divided by one and multiplied by one hundred, the functional error percentage varied between zero and 3.73%. Furthermore, the errors described in the aforesaid application were found under laboratory conditions using highly precise equipment to rotate the Hall generator in a magnetic field. When attempting to incorporate the Hall generator into a sine-cosine source for industrial use, the error factor is greater. Although as taught in the Harac application, it is possible to reduce the functional error resulting solely from the Hall generator, there still remains the functional error when the generator is mechanically incorporated into a rotating device. In the patent application of my fellow employees, Charles Wood et al., Ser. No. 64,174, filed October 21, 1960, now Patent No. 3,162,932, it was shown how to obtain substantially a zero Hall voltage in a zero field, by mechanically cutting into the Hall crystal. But, this means the Hall crystal outside of a rotating device and not a Hall generator inside a rotating device. In practice, the fact that the Hall generator operates perfectly outside the device does not necessarily mean perfect performance in a rotating device since small defects in the Hall generator may compensate for small mechanical errors in the rotating component. Therefore, a component construction is required which is not only small and sturdy, but which can be readily opened to get at the Hall crystal to be able to mechanically adjust the crystal. In this way, a better output is obtained from the sine cosine source rather than merely a better output from the crystal. The importance of accuracy may be better appreciated when we remember that at a distance of 1000 feet, an error of 1⁄10° will mean a difference of 20 inches and at 6000 feet represents a difference of ten feet.

In attempting to design a Hall effect sine cosine source with an almost perfect sinusoidal output, attempts have been made to shape the magnetic means creating the Hall generator field. When using ceramic magnets, these attempts have been successful to some extent, but ceramic magnets are useful only under constant ambient conditions. When used in devices subject to changing ambient conditions of temperature, shock, vibration, such as underwater vehicles, underground exploration, aircraft, space vehicles, etc., other types of magnets more resistant to ambient conditions such as alnico magnets must be used. However, because of the rectangular loop characteristics of alnico magnets, it is impossible to shape these magnets to certain desired configurations, e.g., shaped so as to provide a sinusoidal circular magnetic field with the north and south poles at diametrically opposed points on a cylinder. Although many attempts have been made to use a Hall effect generator to provide a rugged, useful, and accurate sine and cosine source in conjunction with a device having rotating parts, none, as far as we are aware were entirely successful when carried out into practice on an industrial scale.

It has now been discovered that a rugged and accurate sine-cosine source can be provided using a Hall effect generator.

Therefore, an object of the present invention is to provide a small size sine-cosine source.

Another object of the present invention is to provide a small size sine-cosine source utilizing solid state components.

Still another object of the present invention is to provide a small and rugged sine-cosine source made from materials highly resistant to changing ambient conditions.

Generally speaking, the present invention contemplates providing a sine-cosine source designed to be coupled to rotating means and includes the combination of A cylindrical stator housing including end members having an axial opening through one of said end members;

Rotor magnet means designed to rotate within said housing, said rotor magnet means being so constructed that opposing north and south poles face each other, are radially disposed, and are spaced from the axial center of said cylindrical housing;

A rotor hub for coupling to said rotating means passing through said axial opening and coupled to said rotor magnet means to rotate said magnet means within said housing so that said north and south poles turn around the axial center of said housing;

An axial stator cylindrical supporting means rigidly affixed to said housing having first and second longitudinal diametrically cut surfaces, disposed at right angles to each other and located towards the center of the magnetic field formed by said poles;

A Hall generator axially disposed on each of said cut surfaces including excitation and output leads therefrom;

Fastening means adapted to readily fasten and unfasten said end members to said housing; and, Bearing means between said housing and said rotor hub and rotor magnet means to facilitate rotation thereof, whereby, When said Hall generator input leads are properly excited, the rotation of said magnet means north and south poles around said Hall generators will provide a Hall voltage drop across said output leads corresponding to the sine and cosine of said rotating means.

The exact nature of this invention as well as other objects and advantages thereof will be readily apparent from consideration of the following specification relating to the accompanying drawing in which.

Figures 1, 2:
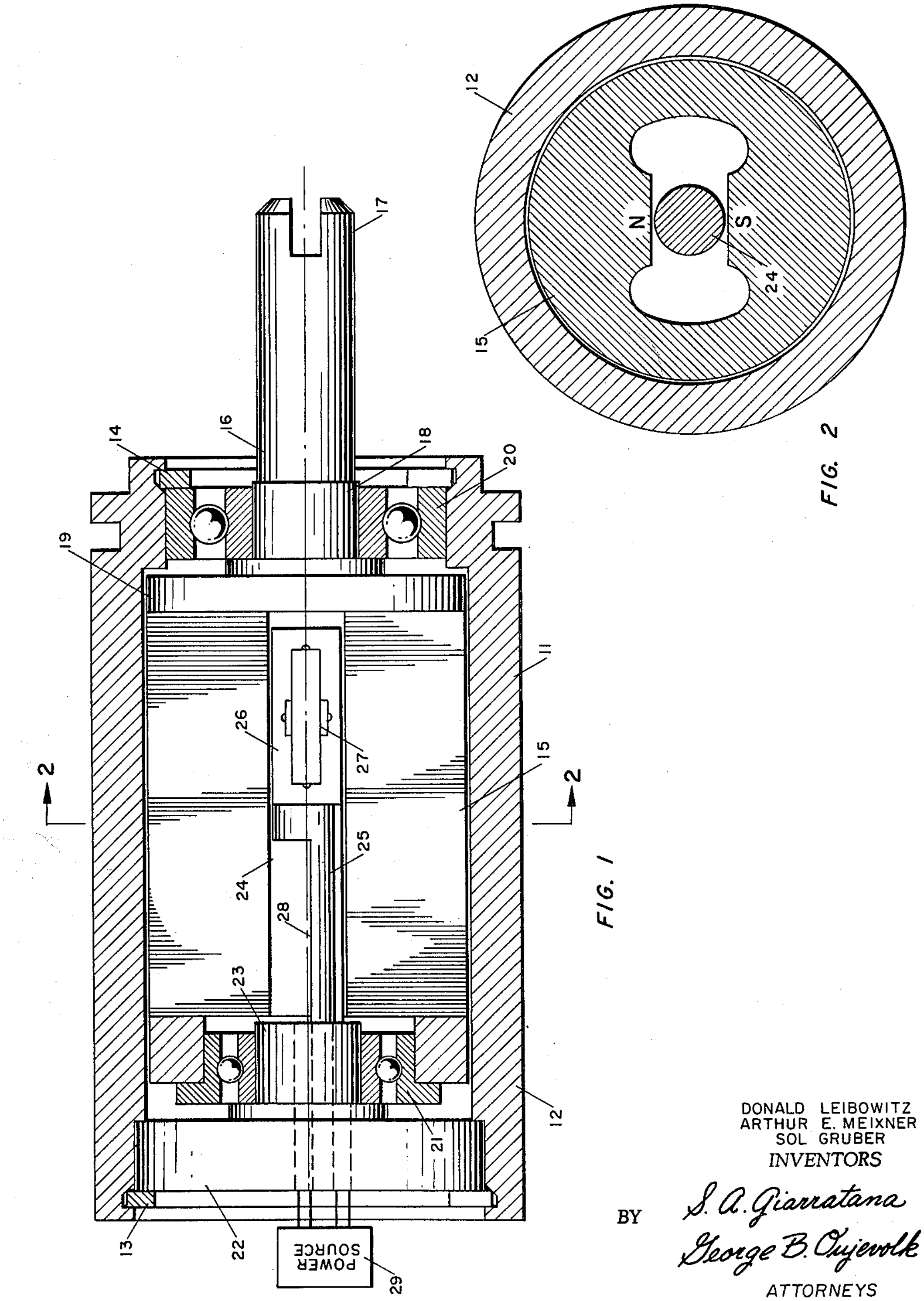
FIGURE 1 is a longitudinal cross section of a sine-cosine source contemplated herein.
FIGURE 2 is a cross sectional view of the device shown in FIGURE 1 taken at the center thereof.
Figure 3:
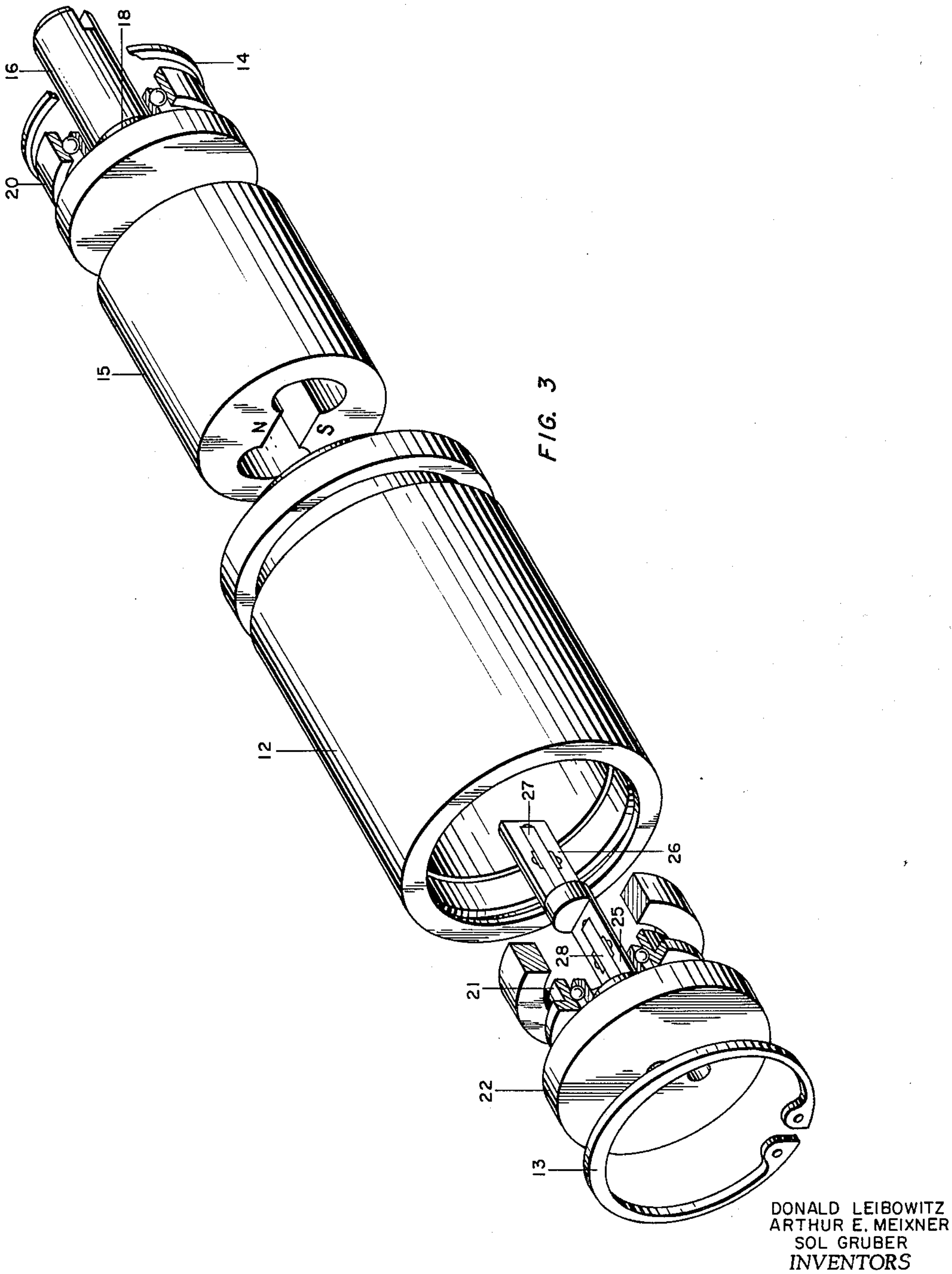
FIGURE 3 shows an exploded view of the device of FIGURE 1.

Shown in the drawing is a sine-cosine source 11 which includes a cylindrical stator housing 12. The assembly inside the housing is retained by end members, e.g., snap rings 13 and 14. The sine-cosine information is to be provided by rotor magnet means 15 mounted on a rotor hub 16 designed to couple the rotor magnet means to the rotating means providing the sine-cosine. Rotor hub 16 includes an engaging section 17, which will engage the rotating means, a neck 18 passing through the housing 12 and a collar 19 for coupling to the rotor magnet means 15. Interposed between the hub and the housing is a hub bearing 20. The stator includes a stator boss 22, used to fasten the stator to the housing, a stator neck 23, designed to furnish support to the rotor magnet means by means of magnet bearing 21, and first and second longitudinal diametrically cut surfaces 25 and 26 disposed at right angles to each other and located towards the center of the magnetic field, on the cylindrical stator support 24. The entire stator assembly should be so disposed that the cylindrical stator support 24 is axial to the cylindrical housing, and the two diametrically cut surfaces 25 and 26 should extend across the axial centerline of the cylindrical housing. Centered on each cut surface is a Hall generator 27 and 28. Cylindrical stator support 24 has holes 25 through which the excitation leads from the Hall generators pass to a power source 29.

In mechanically constructing the device the interior of housing 12 must be perfectly cylindrical and rotor magnet means 15 must be designed to rotate within the housing at a very close tolerance. The rotor magnet means may be one single hollow magnet with opposing poles extending axially within the magnet cylinder. Thus, the magnet region on both sides of the poles is generally elliptical in shape. Although the opposed poles should be disposed at equal distances from the housing cylindrical axis, small errors in this respect are not material. The important thing is that the field created by the poles should be uniform across the cylindrical axis. As is apparent from the construction described, the stator cylindrical support can be readily inserted, adjusted, and removed by removing the end members 13 and 14. In practice, rings such as described are readily removed although of course other types of end member fastening means can be used. After the device has been assembled, it can be tested for true sine and cosine values, and if any difference is found between the value obtained and the true sine, adjustments can be made to the Hall generator or to the stator. In practice, a functional accuracy of over three percent should be attained. Although the device depicted in the drawing shows only one magnet with two opposed poles, it is at once evident that two magnets can also be used. Therefore, magnets more resistant to ambient conditions and having poorer square loop characteristics can be used. Needless to say, the system requires proper lubrication which can be easily supplied. Rotor hub 16 and stator boss 23 are so designed as to dove-tail into the housing and be retained therein by snap rings 13 and 14, retaining the lubrication in the housing.

The construction described furthermore has the advantage that the magnetic field and its loop will not create errors due to hysteresis, and furthermore complete magnetic shielding can be provided.

It is to be observed therefore that the present invention provides for a sine-cosine source, and comprises in combination, a housing 12 designed to house a cylindrical rotating member; rotor magnet means 15 designed to rotate in said housing including radially opposed north and south poles spaced from the housing axial center and coupling means 16 between said rotor magnet means and some external rotating member; an axial cylindrical stator 24 supported in said housing having first and second longitudinal diametrically cut surfaces 25 and 26 disposed at right angles to each other; and, Hall generators 27 and 28 axially disposed on each of said cut surfaces including excitation and output leads therefor.

It will be apparent to those skilled in the art, that our present invention is not limited to the specific details described above and shown in the drawing, and that various modifications are possible in carrying out the features of the invention and the operation and method of support, mounting and utilization thereof, without departing from the spirit and scope of the appended claims.

We claim:

1. A sine-cosine source, comprising in combination,
   a cylindrical stator housing including end members having an axial opening through one of said end members;
   rotor magnet means designed to rotate within said housing, said rotor magnet means being so constructed that opposing north and south poles face each other, are radially disposed, and are spaced from the axial center of said cylindrical housing;
   a rotor hub for coupling to said rotating means passing through said axial opening and coupled to said rotor magnet means to rotate said magnet means within said housing so that said north and south poles turn around the axial center of said housing;
   an axial stator cylindrical supporting means rigidly affixed to said housing having first and second longitudinal diametrically cut surfaces, disposed at right angles to each other and located towards the center of the magnetic field formed by said poles;
   a Hall generator axially disposed on each of said cut surfaces including excitation and output leads therefrom;
   fastening means adapted to readily fasten and unfasten said end members to said housing; and
   bearing means between said housing and said rotor hub and rotor magnet means to facilitate rotation thereof, whereby,
   when said Hall generator input leads are properly excited, the rotation of said magnet means north and south poles around said Hall generators will provide a Hall voltage drop across said output leads corresponding to the sine and cosine of said rotating means.

2. A device as claimed in claim 1, said axial stator having an end boss, said boss and said rotor hub dovetailing into said housing and being retained therein by end member snap rings.

References Cited by the Examiner

UNITED STATES PATENTS

| | | | |
|---|---|---|---|
| 2,924,633 | 2/60 | Sichling | 324—45 X |
| 3,028,092 | 4/62 | Fay | 324—45 X |

FOREIGN PATENTS

| | | |
|---|---|---|
| 342,012 | 1/60 | Switzerland. |

MILTON O. HIRSHFIELD, *Primary Examiner.*

DAXID X. SLINEY, *Examiner.*